United States Patent
Madan

(10) Patent No.: US 8,570,812 B2
(45) Date of Patent: Oct. 29, 2013

(54) METHOD OF READING A FERROELECTRIC MEMORY CELL

(75) Inventor: Sudhir K. Madan, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 76 days.

(21) Appl. No.: 13/199,275

(22) Filed: Aug. 23, 2011

(65) Prior Publication Data

US 2013/0051109 A1 Feb. 28, 2013

(51) Int. Cl.
*G11C 16/06* (2006.01)

(52) U.S. Cl.
USPC ............. 365/185.25; 365/185.18; 365/185.24

(58) Field of Classification Search
USPC ............................ 365/185.25, 185.18, 185.24
See application file for complete search history.

(56) References Cited

U.S. PATENT DOCUMENTS

| | | | | |
|---|---|---|---|---|
| 6,240,020 | B1* | 5/2001 | Yang et al. | 365/185.25 |
| 7,193,882 | B2* | 3/2007 | Takahashi et al. | 365/145 |
| 7,254,074 | B2 | 8/2007 | Yoon et al. | |
| 7,342,819 | B2* | 3/2008 | Liaw et al. | 365/148 |
| 7,601,995 | B2* | 10/2009 | Happ et al. | 257/213 |
| 8,036,021 | B2* | 10/2011 | Fukuda et al. | 365/149 |
| 8,264,897 | B2* | 9/2012 | Kobayashi | 365/203 |
| 8,315,094 | B2* | 11/2012 | Kanda et al. | 365/185.05 |

* cited by examiner

*Primary Examiner* — Pho M Luu
(74) *Attorney, Agent, or Firm* — Rose Alyssa Keagy; W. James Brady; Frederick J. Telecky, Jr.

(57) ABSTRACT

A method of reading a memory cell. The method includes the step of connecting (708) a reference voltage generator (600) to a first bitline (/BL). The first bitline is charged to a reference voltage (VREF) from the reference voltage generator. The reference voltage generator is disconnected (RFWL_A/B low at $t_4$, FIG. 10B) from the first bitline. A signal voltage (PL high at $t_4$, FIG. 10B) from the memory cell is applied to a second bitline (BL) after the step of disconnecting. A difference voltage between the first and second bitlines is amplified (SAEN high at $t_7$, FIGS. 8A and 10B).

26 Claims, 11 Drawing Sheets

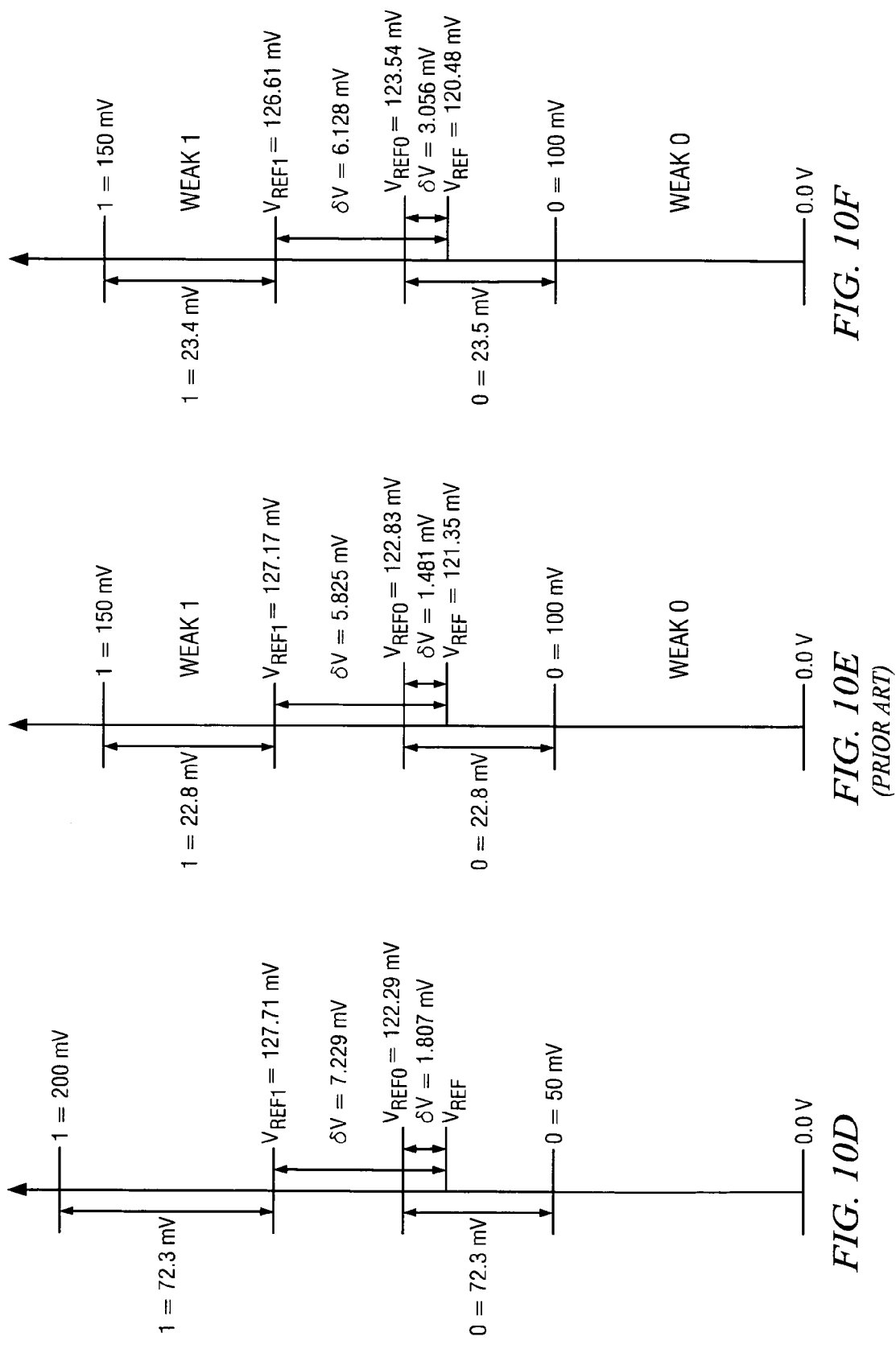

METHOD OF READING A FERROELECTRIC MEMORY CELL

BACKGROUND OF THE INVENTION

Nonvolatile memory circuits such as electrically erasable programmable read only memories (EEPROM) and Flash EEPROMs have been widely used for several decades in various circuit applications including computer memory, automotive applications, and video games. Many new applications, however, require the access time and packing density of previous generation nonvolatile memories in addition to low power consumption for battery powered circuits. One nonvolatile memory technology that is particularly attractive for these low power applications is the ferroelectric memory cell. A major advantage of these ferroelectric memory cells is that they require approximately three orders of magnitude less energy for write operations than previous generation floating gate memories. Furthermore, they do not require high voltage power supplies for programming and erasing charge stored on a floating gate. Thus, circuit complexity is reduced and reliability increased.

The term ferroelectric is something of a misnomer, since present ferroelectric capacitors contain no ferrous material. Typical ferroelectric capacitors include a dielectric of ferroelectric material formed between two closely-spaced conducting plates. One well-established family of ferroelectric materials known as perovskites has a general formula $ABO_3$. This family includes Lead Zirconate Titanate (PZT) having a formula $Pb(Zr_xTi_{1-x})O_3$. This material is a dielectric with a desirable characteristic that a suitable electric field will displace a central atom of the lattice. This displaced central atom, either Titanium or Zirconium, remains displaced after the electric field is removed, thereby storing a net charge. Another family of ferroelectric materials is Strontium Bismuth Titanate (SBT) having a formula $SbBi_2Ta_2O_9$. SBT has several advantages over PZT. However, both ferroelectric materials suffer from fatigue and imprint. Fatigue is characterized by a gradual decrease in net stored charge with repeated cycling of a ferroelectric capacitor. Imprint is a tendency to prefer one state over another if the ferroelectric capacitor remains in that state for a long time as will be discussed in detail. Both fatigue and imprint as well as normal process variations may result in a weak "1" or a weak "0" having less than nominal stored net charge.

A typical one-transistor, one-capacitor (1T1C) ferroelectric memory cell of the prior art is illustrated at FIG. 1. The ferroelectric memory cell is similar to a 1T1C dynamic random access memory (DRAM) cell except for ferroelectric capacitor 100. The ferroelectric capacitor 100 is connected between plateline 110 and storage node 112. Access transistor 102 has a current path connected between bitline 108 and storage node 112. A control gate of access transistor 102 is connected to wordline 106 to control reading and writing of data to the ferroelectric memory cell. This data is stored as a polarized charge corresponding to cell voltage $V_{CAP}$. Capacitance of bitline BL is represented by capacitor $C_{BL}$ 104.

Referring to FIG. 2, there is a hysteresis curve corresponding to the ferroelectric capacitor 100. The hysteresis curve includes net charge Q or polarization along the vertical axis and applied voltage along the horizontal axis. By convention, the polarity of the ferroelectric capacitor voltage is defined as shown in FIG. 1. A stored "0", therefore, is characterized by a positive voltage at the plateline terminal with respect to the access transistor terminal. A stored "1" is characterized by a negative voltage at the plateline terminal with respect to the access transistor terminal. A "0" is stored in a write operation by applying a voltage Vmax across the ferroelectric capacitor. This stores a saturation charge Qs in the ferroelectric capacitor. The ferroelectric capacitor, however, includes a linear component in parallel with a switching component. When the electric field is removed, therefore, the linear component discharges and only the residual charge Qr remains in the switching component. The stored "0" is rewritten as a "1" by applying −Vmax to the ferroelectric capacitor. This charges the linear and switching components of the ferroelectric capacitor to a saturation charge of −Qs. The stored charge reverts to −Qr when the voltage across the ferroelectric capacitor is removed. Finally, coercive points $V_C$ and $-V_C$ are minimum voltages on the hysteresis curve that will degrade a stored data state. For example, application of $V_C$ across a ferroelectric capacitor will degrade a stored "1" even though it is not sufficient to store a "0". Thus, it is particularly important to avoid voltages near these coercive points unless the ferroelectric capacitor is being accessed.

Referring to FIG. 3, there is illustrated a typical write sequence for a ferroelectric memory cell as in FIG. 1. Initially, the bitline (BL), wordline (WL), and plateline (PL) are all low. The upper row of hysteresis curves illustrates a write "1" and the lower row represents a write "0". Either a "1" or "0" is initially stored in each exemplary memory cell. The write "1" is performed when the bitline BL and wordline WL are high and the plateline PL is low. This places a negative voltage across the ferroelectric capacitor and charges it to −Qs. When plateline PL goes high, the voltage across the ferroelectric capacitor is 0 V, and the stored charge reverts to −Qr. At the end of the write cycle, both bitline BL and plateline PL go low and stored charge −Qr remains on the ferroelectric capacitor. Alternatively, the write "0" occurs when bitline BL remains low and plateline PL goes high. This places a positive voltage across the ferroelectric capacitor and charges it to Qs representing a stored "0". When plateline PL goes low, the voltage across the ferroelectric capacitor is 0 V, and the stored charge reverts to Qr representing a stored "0".

A read operation is illustrated at FIG. 4 for the ferroelectric memory cell at FIG. 1. The upper row of hysteresis curves illustrates a read "0". The lower row of hysteresis curves illustrates a read "1". Wordline WL and plateline PL are initially low. Bitlines BL are precharged low. At time $\Delta t_0$ bitline precharge signal PRE goes low, permitting the bitlines BL to float. At time $\Delta t_1$ both wordline WL and plateline PL go high, thereby permitting each memory cell to share charge with a respective bitline. A stored "1" will share more charge with parasitic bitline capacitance $C_{BL}$ and produce a greater bitline voltage than the stored "0" as shown. A reference voltage (FIG. 6) is produced at each complementary bitline of an accessed bitline. This reference voltage is between the "1" and "0" voltages. Sense amplifiers are activated at the time boundary between $\Delta t_1$ and $\Delta t_2$. When respective bitline voltages are fully amplified in time $\Delta t_2$, the read "0" curve cell charge has increased from Qr to Qs. By way of comparison, the read "1" data state has changed from a stored "1" to a stored "0". Thus, the read "0" operation is nondestructive, but the read "1" operation is destructive. At time $\Delta t_3$, plateline PL goes low and applies −Vmax to the read "1" cell, thereby storing −Qs. At the same time, zero voltage is applied to the read "0" cell and charge Qr is restored. At the end of time $\Delta t_3$, signal PRE goes high and precharges both bitlines BL to zero volts or ground. Thus, zero volts is applied to the read "1" cell and −Qr is restored.

Referring to FIGS. 5A and 5B, there are timing diagrams illustrating two different types of sensing that may be used in ferroelectric memory circuits. A primary difference between these two schemes is that the step sensing scheme (FIG. 5A)

uses a single pulse of plateline PL, while the pulse sensing scheme (FIG. 5B) uses a double pulse of plateline PL. For both types of sensing, bitline precharge signal PRE goes low at time $t_0$, thereby permitting the bitlines BL to float. Next, wordline WL goes high at time $t_1$ to turn on access transistors of a row of memory cells. Plateline PL goes high between times $t_1$ and $t_2$, permitting ferroelectric memory cells share charge with their respective bitlines BL and develop respective difference voltages. Here, $V_1$ represents a data "1" and $V_0$ represents a data "0". The difference voltage available for sensing is the difference between one of $V_1$ and $V_0$ and a reference voltage (FIG. 6) which lies approximately midway between voltages $V_1$ and $V_0$. This difference voltage is amplified at time $t_3$ for the step sensing scheme (FIG. 5A) so that full bitline BL voltages are developed before the plateline PL goes low at time $t_4$. The data "0" cell is fully restored between time $t_3$ and time $t_4$ while plateline PL is high and the data "0" bitline BL is low. At time $t_4$, the plateline PL goes low while the data "1" bitline BL remains high. Thus, the data "1" cell is restored between time $t_4$ and time $t_5$. Bitline precharge signal PRE goes high at time $t_5$, thereby precharging the bitlines BL to ground or 0 V. The step sensing cycle is completed when wordline WL goes low at time $t_6$ to store respective data in the row of memory cells.

Referring now to FIG. 5B, the first pulse of plateline PL develops a difference voltage at time $t_2$. Plateline PL then goes low at time $t_3$, and the common mode difference voltage goes to near 0 V. Then the difference voltage is amplified at time $t_4$, and full bitline BL voltages are developed while the plateline PL is low. Thus, the data "1" cell is restored between time $t_4$ and time $t_5$ while plateline PL is low and the data "1" bitline BL is high. At time $t_5$, the plateline PL goes high while the data "0" bitline BL remains low. Thus, the data "0" cell is restored between time $t_5$ and time $t_6$. The data "1" cell is again restored between time $t_6$ and time $t_7$ while plateline PL is low and the data "1" bitline BL is high. Bitline precharge signal PRE goes high at time $t_7$, thereby precharging the bitlines BL to ground or 0V. The pulse sensing cycle is completed when wordline WL goes low at time $t_8$.

BRIEF SUMMARY OF THE INVENTION

In a preferred embodiment of the present invention, a method of reading a memory cell is disclosed. The method includes connecting a reference voltage generator to a first bitline. The first bitline is charged to a reference voltage from the reference voltage generator. The reference voltage generator is disconnected from the first bitline. A signal voltage from the memory cell is applied to a second bitline after disconnecting the reference voltage generator from the first bitline. A difference voltage between the first and second bitlines is amplified.

BRIEF DESCRIPTION OF THE SEVERAL VIEWS OF THE DRAWING

FIG. 10D is a voltage diagram illustrating operation of the memory array of FIG. 8 according to the present invention art;

FIG. 10E is a voltage diagram illustrating operation of the memory array of FIG. 8 with a single weak "1" among normal "1 s" and a single weak "0" among normal "0 s" according to the prior art;

FIG. 10F is a voltage diagram illustrating operation of the memory array of FIG. 8 a single weak "1" among normal "1 s" and a single weak "0" among normal "0 s" according to the present invention.

DETAILED DESCRIPTION OF THE INVENTION

Figure 1:
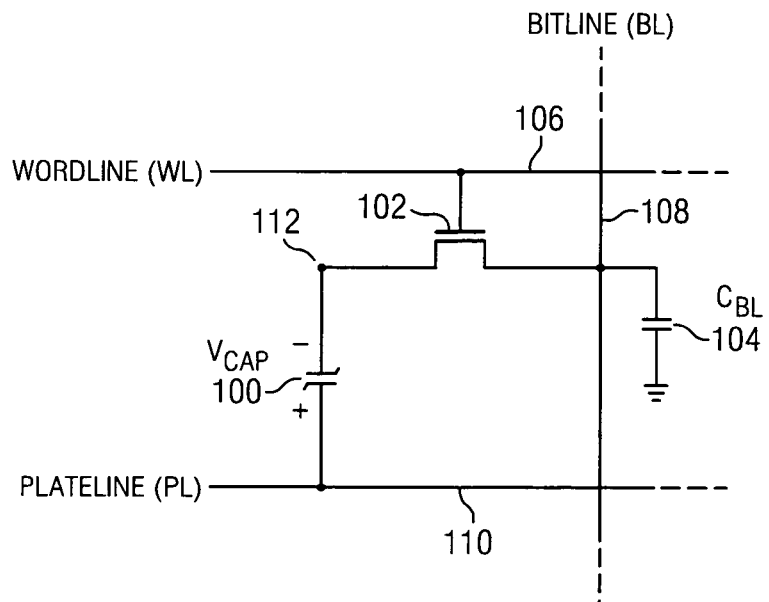
FIG. 1 is a circuit diagram of a ferroelectric memory cell of the prior art.
Figure 2:
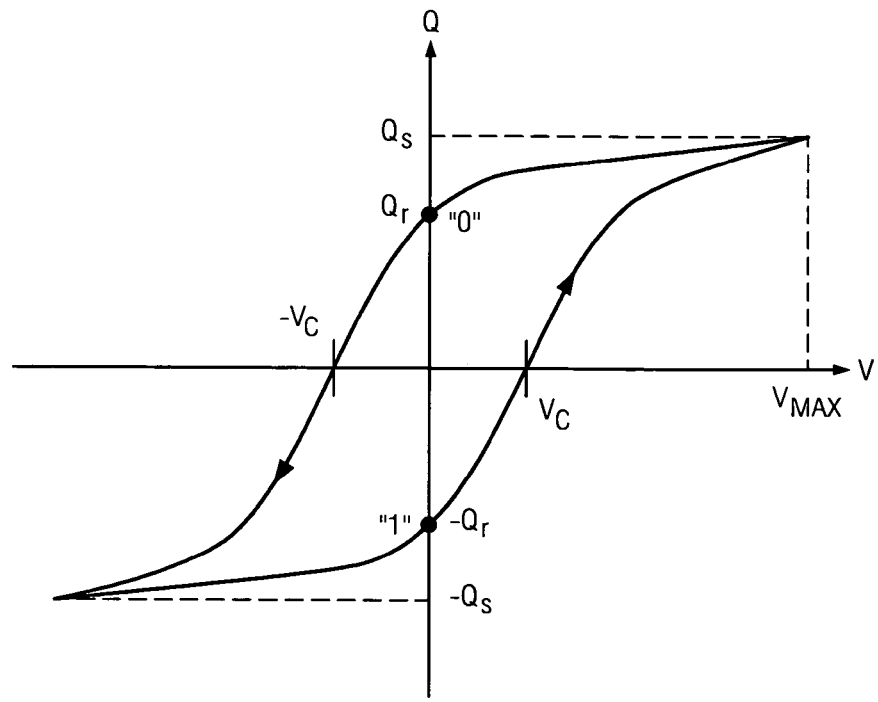
FIG. 2 is a hysteresis curve of the ferroelectric capacitor 100 of FIG. 1.
Figure 3:
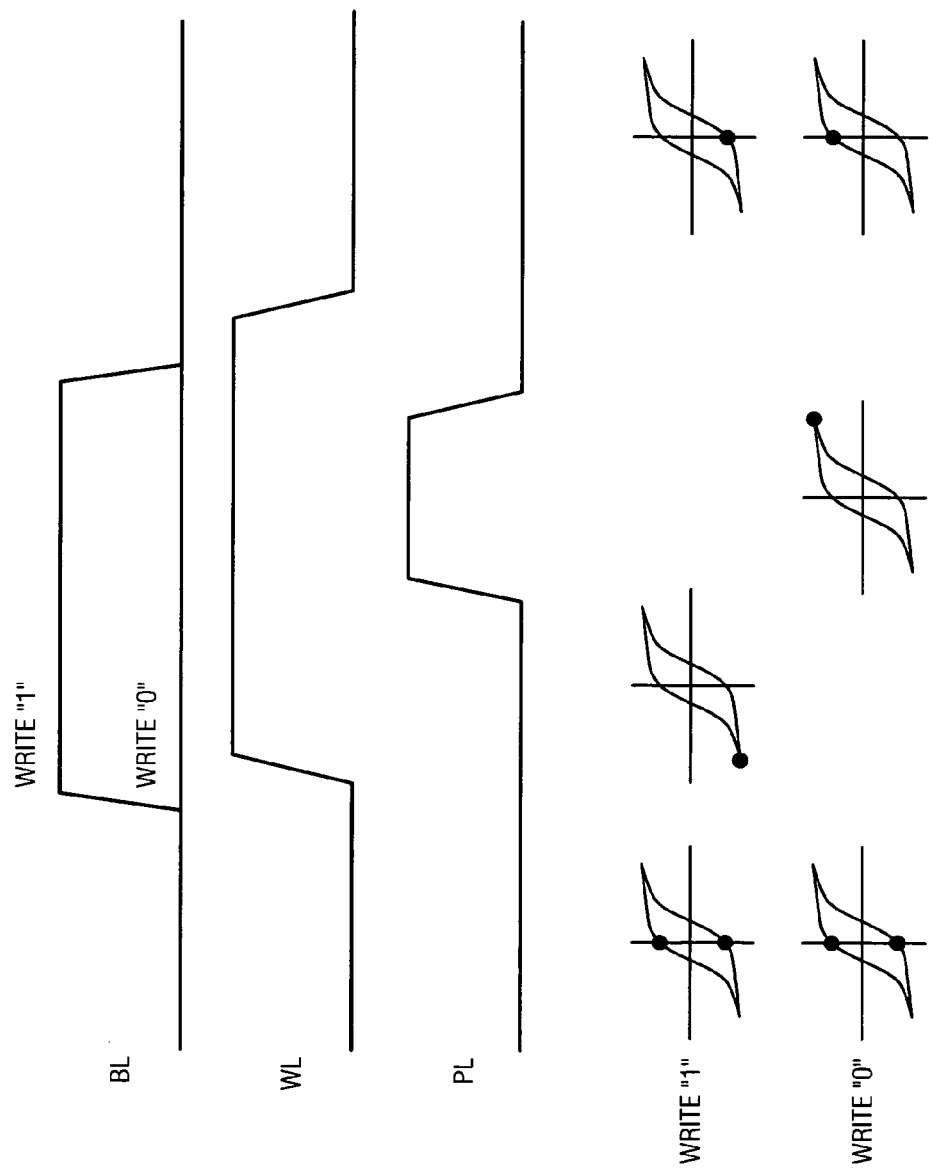
FIG. 3 is a timing diagram showing a write operation to the ferroelectric memory cell of FIG. 1.
Figure 4:
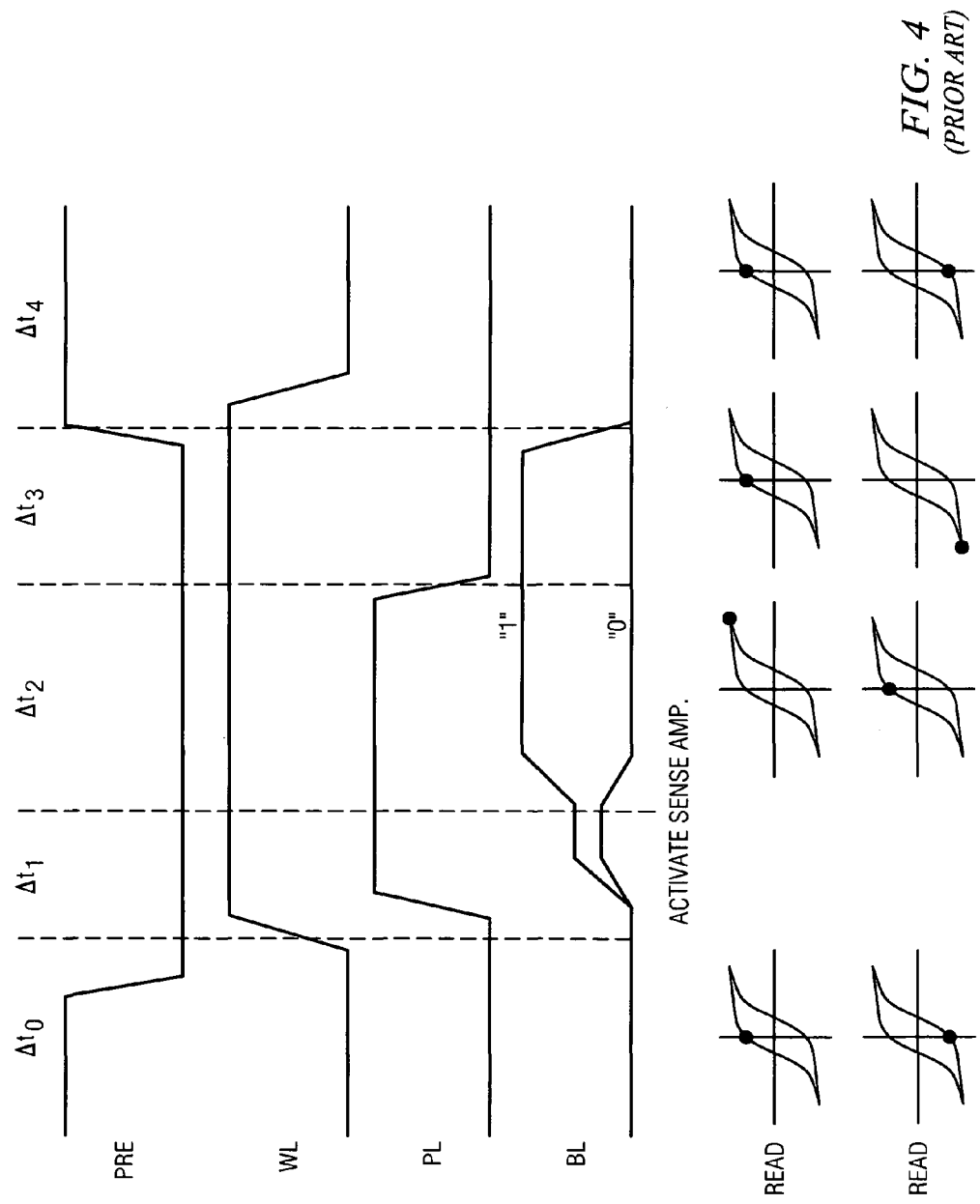
FIG. 4 is a timing diagram showing a read operation from the ferroelectric memory cell of FIG. 1.
Figure 5A:
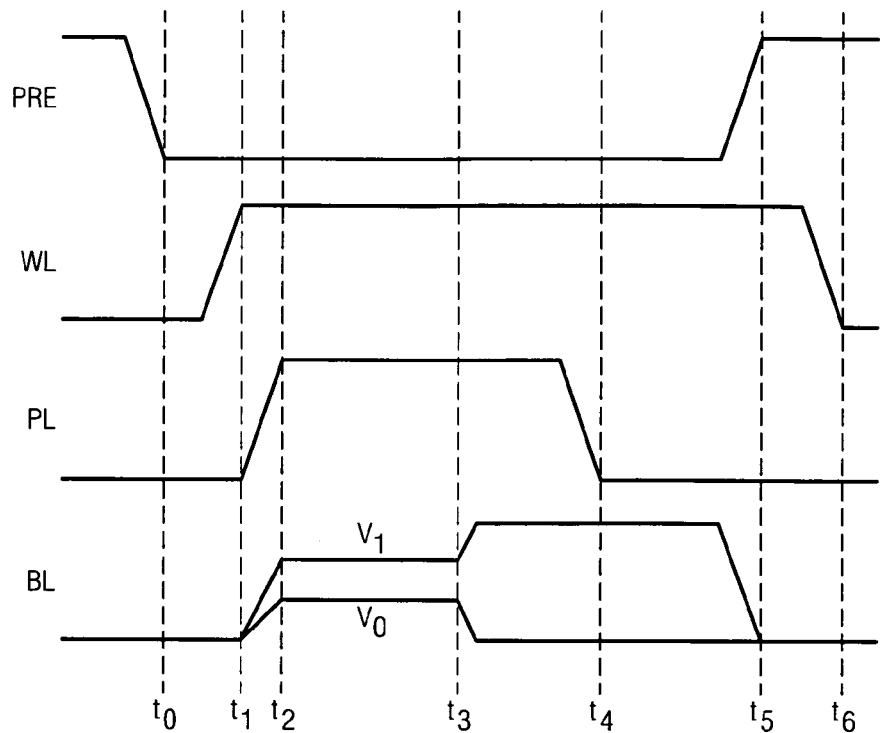
FIG. 5A is a timing diagram of a step sense read cycle.
Figure 5B:
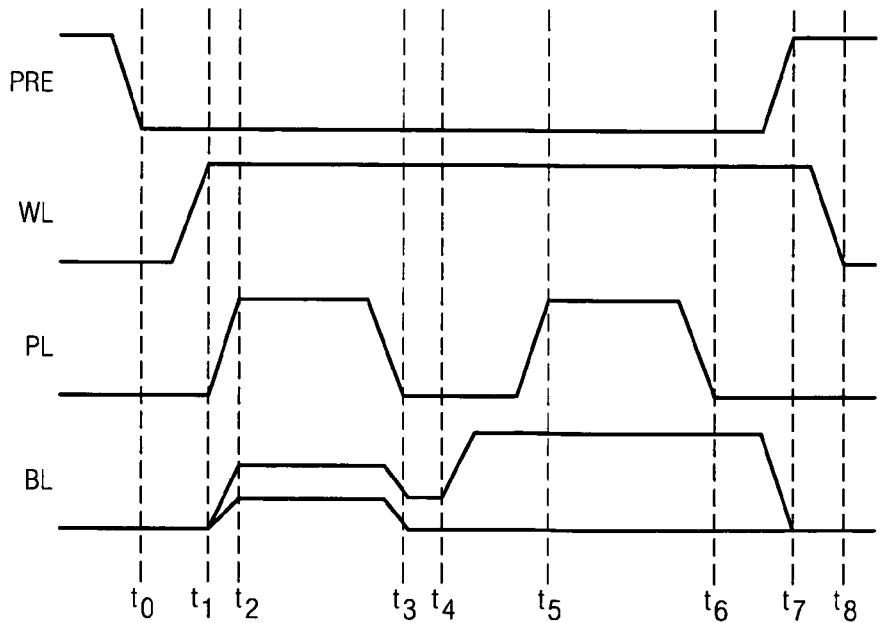
FIG. 5B is a timing diagram of a pulse sense read cycle.

Preferred embodiments of the present invention provide significant advantages in reading memory cells having weak "1" or "0" states compared to nominal memory cells of a memory array as will be discussed in detail. In the following discussion, the same reference numerals are used in the drawing figures to indicate common circuit elements.

Figure 8A:
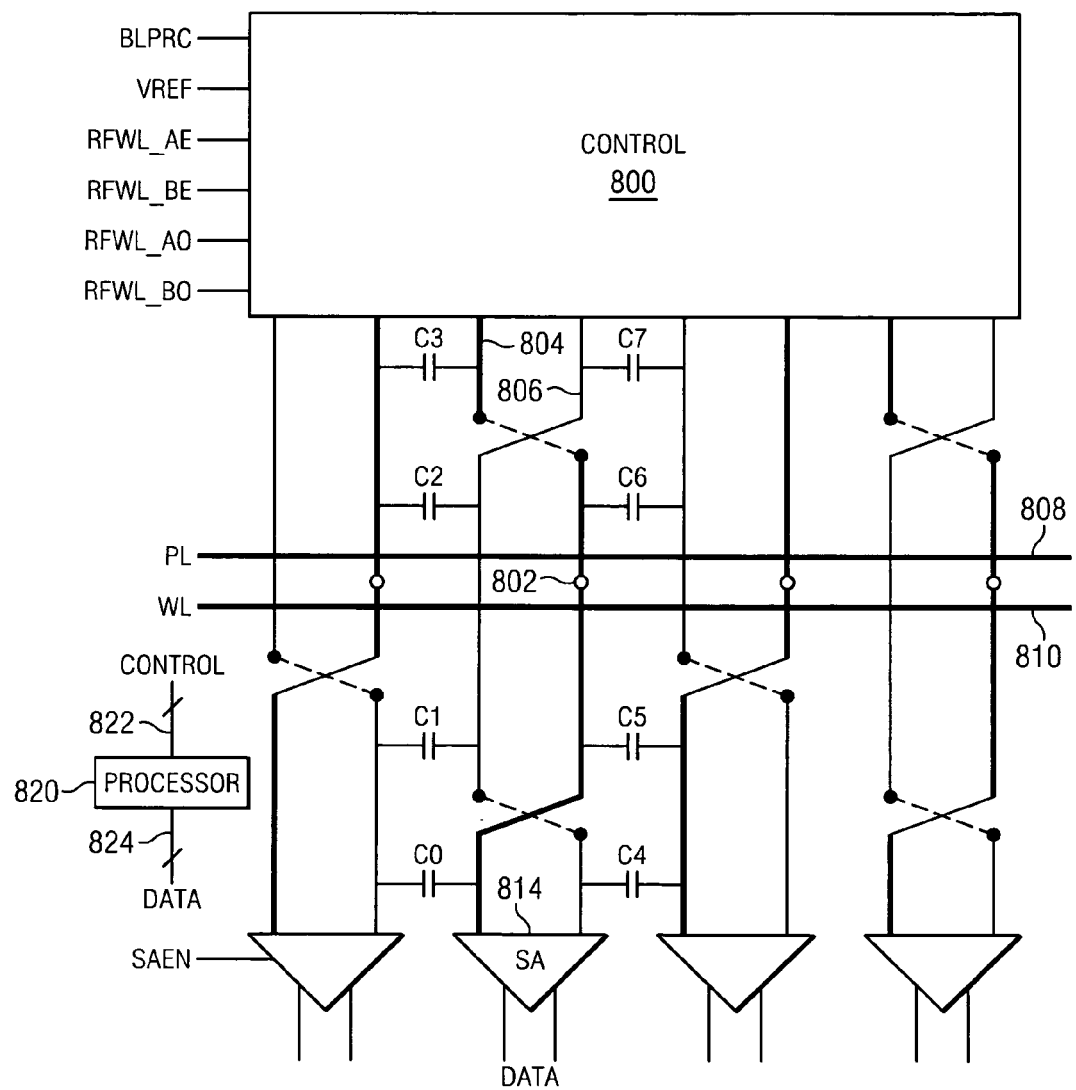
FIG. 8A is a schematic diagram of a memory system of the present invention.

Referring to FIG. 8A, there is a simplified schematic diagram of a memory system of the present invention. The memory system includes control circuit 800 and processor circuit 820. Processor circuit 820 is coupled to control bus 822 for receiving external control signals and producing internal control signals to control the memory array and other associated circuitry. Processor circuit 820 is also coupled to data bus 824 for sending data signals to and receiving data signals from the memory array during respective write and read operations and for providing data signals to other associated circuitry.

Control circuit 800 receives several control signals to control operation of the memory array. Among these are bitline precharge signal BLPRC and reference wordline signals RFWL_AE, RFWL_BE, RFWL_AO, and RFWL_BO. Here, the A and B suffixes indicate respective bitlines of a column. The O and E suffixes indicate odd and even columns, respectively. By way of example, the memory array connected to control circuit 800 includes four columns. Each column has a respective bitline pair arranged in a triple twist configuration as is known in the art. Representative memory cells of the columns are indicated by small circles. The memory cells are connected to respective bitlines by an active wordline signal WL. Data signals from the memory cells are applied to respective bitlines by an active plateline signal PL. Here, signal bitlines having active memory cells are indicated as bold lines. Reference bitlines are connected to other memory cells that are not active when memory cells on signal bitlines are active. For example, wordline 810 and plateline 808 are connected to a row of active memory cells including memory cell 802. Memory cell 802 is connected to signal bitline 804. Reference bitline 806 together with signal bitline 804 form a column of memory cells. Each column of memory cells is connected to a respective sense amplifier indicated by triangles to send data signals to and receive data signals from memory cells connected to the bitlines. Each sense amplifier is activated by a sense amplifier enable signal SAEN to amplify a difference voltage between the signal bitline and the reference bitline. Here, sense amplifier 814 is connected to the column having signal bitline 804 and reference bitline 806. Capacitors C0 through C7 indicate parasitic fringe capacitance of bitlines 804 and 806 with adjacent bitlines as will be discussed in detail.

Figure 6:
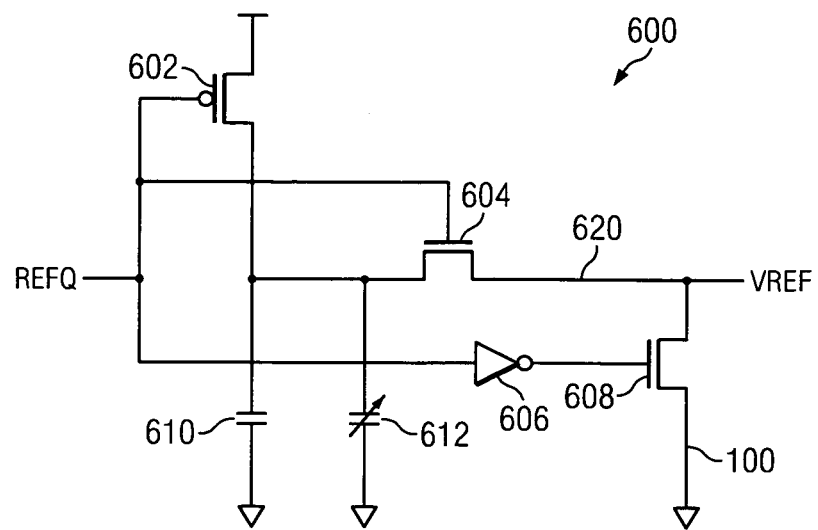
FIG. 6 is a reference voltage (VREF) generator that may be used with the present invention.

Referring now to FIG. 6, there is a reference voltage generator 600 that may be used with the present invention to produce reference voltage VREF on reference bitlines. The reference voltage generator includes fixed capacitor 610 and variable capacitor 612. Variable capacitor 612 may be programmed by electrical fuses to provide fine adjustment of the total capacitance of the voltage reference generator. The voltage reference generator is coupled to receive reference control signal REFQ. In a precharge state, REFQ remains low so that p-channel transistor 602 is on. This precharges capacitors 610 and 612 to the supply voltage at the source terminal of p-channel transistor 602. The low level of REFQ turns off n-channel transistor 604 and produces a high signal at the output of inverter 606 to turn on n-channel transistor 608. Thus, n-channel transistor 608 precharges lead 620 to ground or the base voltage at lead 100.

In an active state, REFQ goes high to turn off p-channel transistor 602 and turn on n-channel transistor 604. The high level of REFQ, produces a low level signal at the output of inverter 606 to turn off n-channel transistor 608. Thus, reference bitlines and parasitic bus capacitance that were precharged to ground now share charge with capacitors 610 and 612 to produce reference voltage VREF as will be explained in detail.

Figure 7:
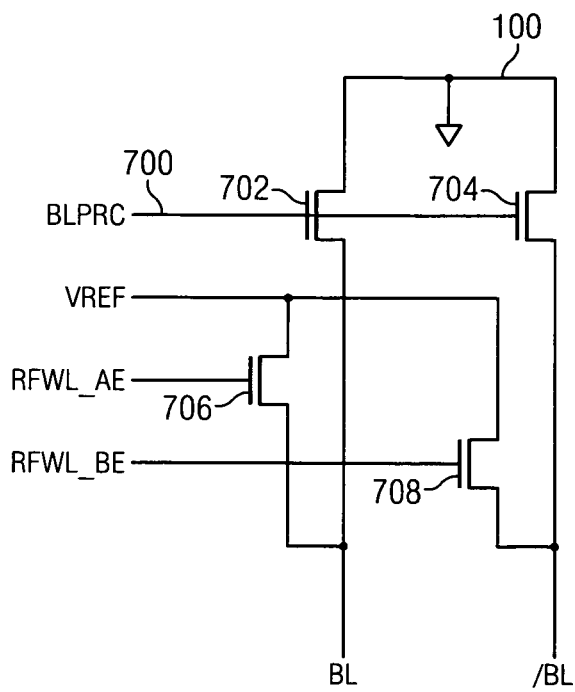
FIG. 7 is a control circuit for an even column that may be used with control circuit 800 of FIG. 8.

Turning now to FIG. 7, there is a control circuit for an even column that may be used with control circuit 800 of FIG. 8. A control circuit for an odd column is the same as shown in FIG. 7 except that it is coupled to receive reference control signals RFWL_AO and RFWL_BO. In a preferred embodiment of the present invention, there is a separate control circuit as in FIG. 7 for each respective column of the memory array of FIG. 8. In a precharge mode, n-channel transistors 702 and 704 are turned on by a high level of bitline precharge signal BLPRC on lead 700. This initially precharges complementary bitlines BL and /BL to ground or a base voltage at lead 100. When a memory cell on either BL or /BL is read from or written to, BLPRC goes low and one of RFWL_AE and RFWL_BE goes high while the other remains low. For example, if a memory cell on BL is to be read from, RFWL_AE remains low and n-channel transistor 706 remains off. In this case, BL is a signal bitline. Correspondingly, RFWL_BE goes high to turn on n-channel transistor 708 and charge bitline /BL to VREF. In this case, bitline /BL is a reference bitline.

Referring back to FIG. 8A, capacitors C0 through C7 indicate parasitic fringe capacitance of bitlines 804 and 806 with adjacent columns. Each of capacitors C0 through C7 have approximately the same value equal to about one fourth of the fringe capacitance of one edge of a signal or reference bitline to adjacent bitlines. The following discussion will first address the case where all active memory cells of the memory array store a "1" to couple a positive voltage to their respective signal bitlines in response to a low-to-high transition of plateline signal PL. In particular, capacitors C0 and C6 couple a voltage change on signal bitline 804 to adjacent reference bitlines. Capacitors C3 and C5 are coupled between signal bitline 804 and adjacent signal bitlines. However, there is no charge transfer through C3 and C5 since the voltage change on all signal bitlines is the same. In a similar manner, capacitors C2 and C4 couple a voltage change on adjacent signal bitlines to reference bitline 806. Capacitors C1 and C7 are coupled between reference bitline 806 and adjacent reference bitlines. However, there is no charge transfer through C1 and C7 since the voltage change on all reference bitlines is the same.

Figure 8B:
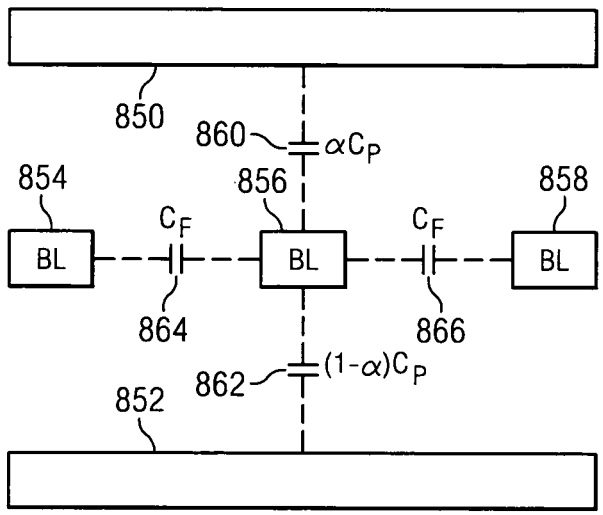
FIG. 8B is a diagram illustrating fringe and planar parasitic capacitance.

Turning now to FIG. 8B, there is a simplified diagram illustrating fringe and planar parasitic capacitance. By way of example, bitline 856 is a reference bitline such as reference bitline 806 in the previous discussion. Regions 850 and 852 represent conductive surfaces above and below bitline 856 that remain at a fixed voltage. Bitline 856 is coupled to regions 850 and 852 by capacitors 860 and 862, respectively. Capacitor 860 has a value of $\alpha C_p$, where $\alpha$ is a positive real number between 0 and 1. Capacitor 862 has a value of $(1-\alpha) C_p$, so that a total capacitance of capacitors 860 and 862 is $C_p$. Adjacent bitlines 854 and 858 are signal bitlines. Parasitic fringe capacitors 864 and 866 are coupled between reference bitline 856 and signal bitlines 854 and 858, respectively. Voltage coupled to reference bitline 856 during an all "1" read operation is due to a voltage transition of its own signal bitline in the same column together with adjacent signal bitlines. Fringe capacitance between reference bitline 856 and its own signal bitline is equal to $C_F$. Fringe capacitance between reference bitline 856 and adjacent signal bitlines is equal to 0.5 $C_F$ or the sum of capacitors C2 and C4 as previously discussed.

Figure 9A:
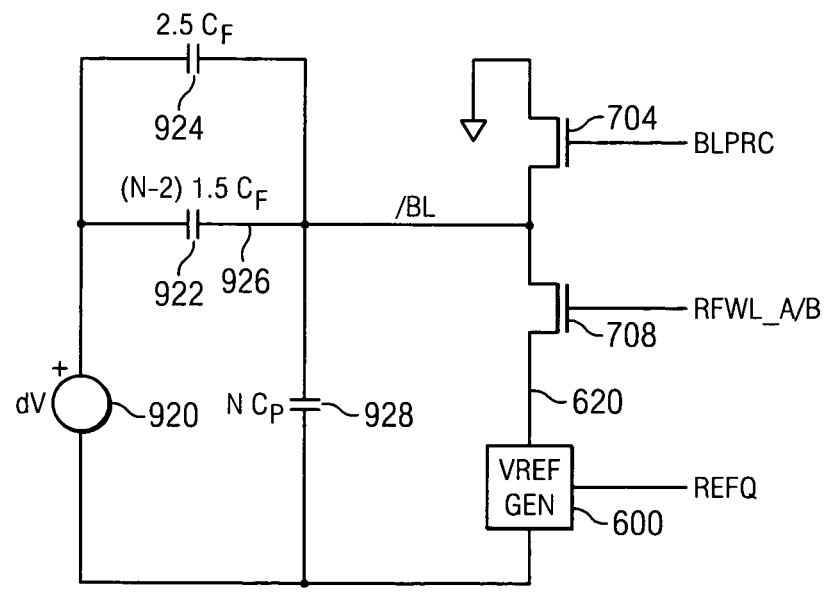
FIG. 9A is a schematic diagram illustrating coupling to reference bitline /BL from N columns the memory array of FIG. 8.
Figure 10A:
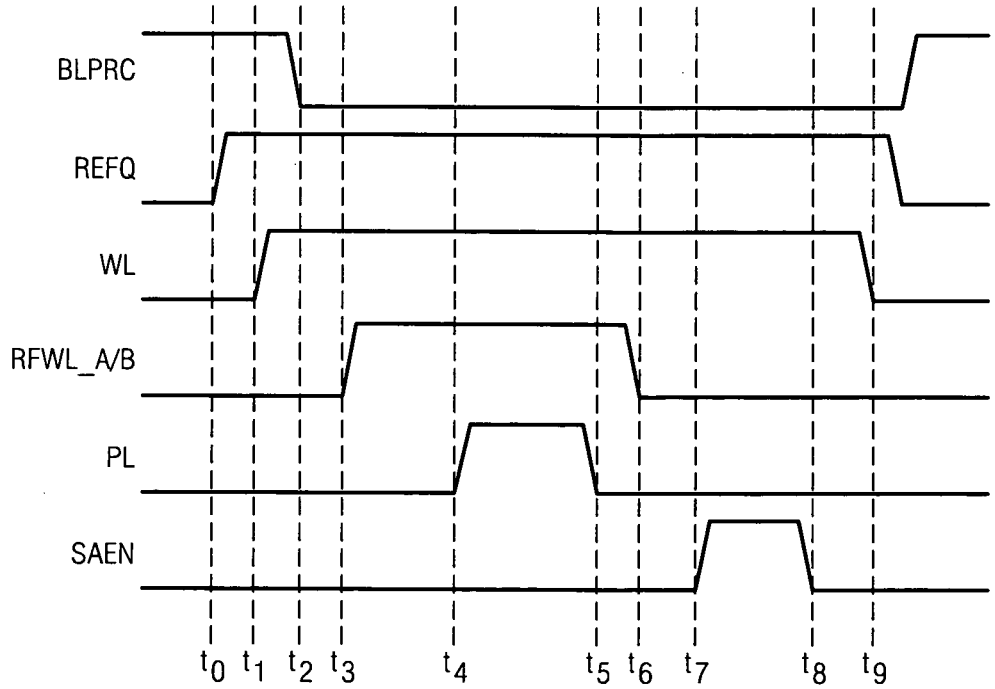
FIG. 10A is a timing diagram illustrating operation of the memory array of FIG. 8 according to the prior art.

Referring now to FIG. 9A, there is of a schematic diagram illustrating capacitive coupling to lumped reference bitlines /BL from N columns the memory array of FIG. 8. Here and in the following discussion N is a positive integer. This is representative of the coupling according to the timing diagram of FIG. 10A of the prior art. The model includes a signal voltage transition dV 920 from N lumped memory cells in response to an active plateline signal PL. The signal voltage dV is coupled through capacitors 922 and 924 to planar capacitor 928 of bitlines /BL. Capacitor 924 represents coupling between reference bitlines at the edge of the memory array and adjacent signal bitlines. As previously discussed, BLPRC is high at time $t_0$ so that n-channel transistor 704 precharges all reference bitlines /BL to ground. At time $t_0$ reference control signal REFQ goes high and reference voltage generator 600 shares charge with the parasitic capacitance on lead 620. At time $t_1$, wordline WL goes high to connect a row of active memory cells to their respective signal bitlines. At time $t_2$ BLPRC goes low to turn off n-channel transistor 704. This effectively floats all bitlines at a precharge or base voltage. At time $t_3$, RFWL_A/B goes high, thereby turning on n-channel transistor 708 and connecting the reference voltage generator 600 to reference bitlines /BL. Here, RFWL_A/B generally applies to either odd or even columns and is the same as the RFWL_AE, RFWL_BE, RFWL_AO, or RFWL_BO signals of FIG. 8. At time $t_4$, plateline signal PL goes high to apply signal voltage dV from N active memory cells to respective signal bitlines. At time $t_5$, plateline signal PL returns low. Next, at time $t_6$ after charge sharing with reference bitlines /BL is complete, RFWL_AB goes low, thereby turning off n-channel transistor 708. At time $t_7$, SAEN goes high to activate column sense amplifiers to amplify a difference voltage between signal bitlines and their respective reference bitlines. Data signals are transmitted to processor circuit 820 via data bus 824 and SAEN returns low at time $t_8$. Finally, after time $t_9$, REFQ and BLPRC return to their respective low and high precharge levels.

Figure 9B:
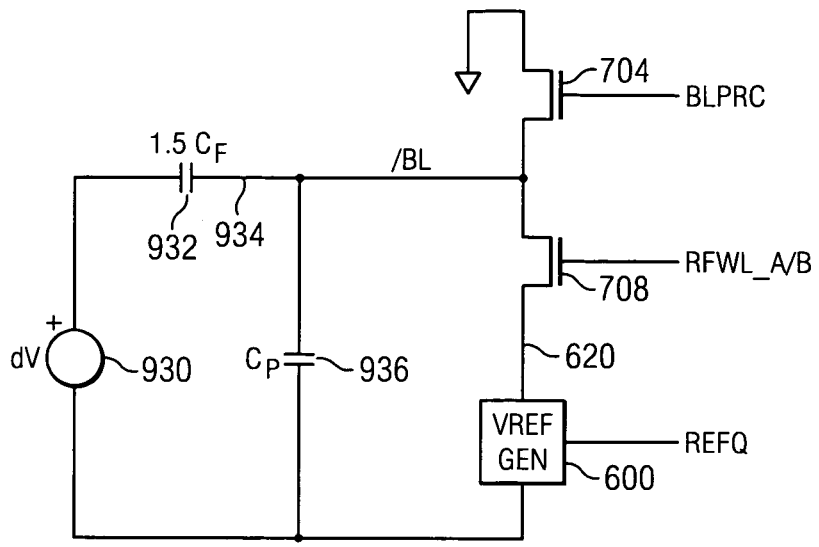
FIG. 9B is a schematic diagram illustrating coupling from adjacent columns in the memory array of FIG. 8.

Referring now to FIG. 9B, there is of a schematic diagram illustrating capacitive coupling to reference bitline /BL from adjacent columns the memory array of FIG. 8. This is representative of the coupling according to the timing diagram of FIG. 10B of the present invention. The model includes a signal voltage transition dV 930 from a memory cell in response to an active plateline signal PL. The signal voltage dV is coupled through capacitor 932 to planar capacitor 936 of bitline /BL. Here, however, reference bitline is a single bitline rather than N bitlines. As previously discussed, BLPRC is high at time $t_0$ so that n-channel transistor 704 precharges all reference bitlines /BL to ground. At time $t_0$ reference control signal REFQ goes high and reference voltage generator 600 shares charge with the parasitic capacitance on lead 620. At time $t_1$, wordline WL goes high to connect a row of active memory cells to their respective signal bitlines. At time $t_2$ BLPRC goes low to turn off n-channel transistor 704. This effectively floats all bitlines at a precharge or base voltage. At time $t_3$, RFWL_AB goes high, thereby turning on n-channel transistor 708 and connecting the reference voltage generator 600 to N reference bitlines /BL. Here, RFWL_A/B generally applies to either odd or even columns and is the same as the RFWL_AE, RFWL_BE, RFWL_AO, of RFWL_BO signals of FIG. 8. Next at time $t_4$ after charge sharing with N reference bitlines /BL is complete, RFWL_AB goes low, thereby turning off n-channel transistor 708 and disconnecting the reference voltage generator 600 from the N reference bitlines /BL. This effectively floats all reference bitlines at a reference voltage. At time $t_4$, plateline signal PL goes high to apply signal voltage dV from active memory cells to respective signal bitlines. At time $t_5$, plateline signal PL returns low. At time $t_7$, SAEN goes high to activate column sense amplifiers to amplify a difference voltage between signal bitlines and their respective reference bitlines. Data signals are transmitted to processor circuit 820 via data bus 824 and SAEN returns low at time $t_8$. Finally, after time $t_9$, REFQ and BLPRC return to their respective low and high precharge levels.

A major difference between the operation of circuits at FIGS. 9A and 9B as described by timing diagrams 10A and 10B, respectively, is due to the high-to-low transition of RFWL_A/B. This advantageously turns off n-channel transistor 708 and disconnects reference bitlines from reference voltage generator 600 prior to application of a signal voltage to signal bitlines. In the circuit of FIG. 9A, RFWL_A/B goes low after plateline signal PL goes high. Thus, the signal bitlines of all N active columns couple signal voltage to N reference bitlines and to capacitors 610 and 612 of the reference voltage generator 600. By way of comparison, the circuit of FIG. 9B disconnects the reference voltage generator 600 from the reference bitlines prior to application of a signal voltage to signal bitlines. In this way, reference bitlines only receive charge coupled from their own signal bitline and from adjacent signal bitlines. There is no global coupling from other signal bitlines in the memory array.

Figures 10B, 10C:
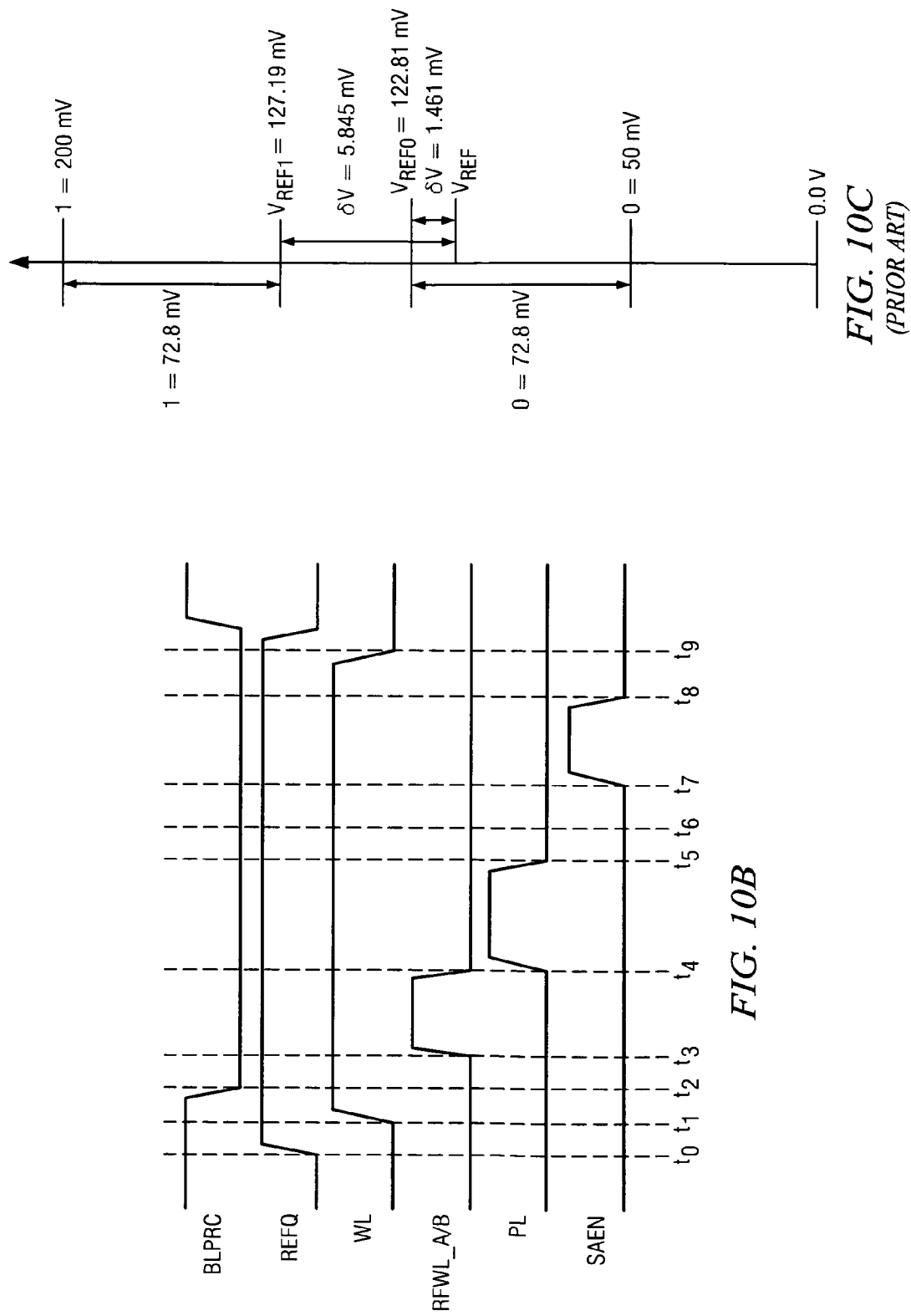
FIG. 10B is a timing diagram illustrating operation of the memory array of FIG. 8 according to the present invention.
FIG. 10C is a voltage diagram illustrating operation of the memory array of FIG. 8 according to the prior art.

Turning now to FIGS. 10C and 10D, there is a comparison of the coupling for circuits 9A and 9B, respectively, for all "1" and all "0" data states. In the following discussion a nominal "1" produces 200 mV on the signal bitline. Correspondingly, a nominal "0" produces 50 mV on the signal bitline. According to a preferred embodiment of the present invention, N=72, $C_F$=5 fF, $C_p$=200 fF, parasitic capacitance on lead 620 is 2.0 pF, and $V_{REF}$ is optimized to produce approximately the same difference voltage for an all "1" or all "0" read. Referring to FIG. 10C, an all "1" read couples 5.845 mV (δV) to $V_{REF}$ to produce 127.19 mV ($V_{REF1}$) on all reference bitlines. Thus, the difference voltage between the signal bitlines and the reference bitlines is 72.8 mV (200 mV-127.19 mV). An all "0" read couples 1.461 mV (δV) to $V_{REF}$ to produce 122.81 mV ($V_{REF0}$) on all reference bitlines. Thus, the difference voltage between the signal bitlines and the reference bitlines is 72.8 mV (122.81 mV-50 mV). Referring now to FIG. 10D, an all "1" read couples 7.229 mV (δV) to $V_{REF}$ to produce 127.71 mV ($V_{REF1}$) on all reference bitlines. Thus, the difference voltage between the signal bitlines and the reference bitlines is 72.3 mV (200 mV-127.71 mV). An all "0" read couples 1.807 mV (δV) to $V_{REF}$ to produce 122.29 mV ($V_{REF0}$) on all reference bitlines. Thus, the difference voltage between the signal bitlines and the reference bitlines is 72.3 mV (122.29 mV-50 mV). Thus, an all "1" or an all "0" read of FIG. 10D produces a difference voltage that is about 0.5 mV less than a corresponding difference voltage for an all "1" or an all "0" read of FIG. 10C. This is less than a 1% reduction in the difference voltage.

Turning now to FIGS. 10E and 10F, there is a comparison of the coupling for circuits 9A and 9B, respectively, for all "1" and all '0' data states where the signal of interest is either a weak "1" or a weak '0' in one of the columns while other columns have normal signal strengths. In the following discussion a weak "1" produces 150 mV on the signal bitline in one column while other columns have a normal signal strength of 200 mV. Correspondingly, a weak "0" produces 100 mV on the signal bitline in one column while other columns have a normal signal strength of 50 mV. Other parameters are the same as previously discussed with respect to FIGS. 10C and 10D, and $V_{REF}$ is optimized to produce the same difference voltage for an all "1" or all "0" read. Referring to FIG. 10E, a nominal all "1" read with a weak "1" read couples 5.825 mV (δV) to $V_{REF}$ to produce 127.17 mV ($V_{REF1}$) on all reference bitlines. This is approximately the same as in FIG. 10C, except the coupling is slightly less due to the relatively lower coupling from the weak "1" column. The difference, however, is negligible. Thus, the difference voltage between a weak "1" signal bitline and reference bitlines is 22.8 mV (150 mV-127.17 mV). A nominal all "0" read with a weak "0" couples 1.481 mV (δV) to $V_{REF}$ to produce 122.83 mV ($V_{REF0}$) on all reference bitlines. Thus, the difference voltage between a weak "0" signal bitline and reference bitline is 22.8 mV (122.83 mV-100 mV). This is approximately the same as in FIG. 10C, except the coupling is slightly greater due to the relatively higher coupling from the weak "0" column. The difference, however, is negligible. Referring now to FIG. 10F, a nominal all "1" read with a weak "1" couples 6.128 mV (δV) to $V_{REF}$ to produce 126.61 mV ($V_{REF1}$) on the reference bitline of the weak "1" column. Thus, the difference voltage between a weak "1" signal bitline and reference bitline is 23.4 mV (150 mV-126.61 mV). A nominal all "0" read with a weak "0" couples 3.056 mV (δV) to $V_{REF}$ to produce 123.54 mV ($V_{REF0}$) on the reference bitline of the weak "0" column. Thus, the difference voltage between a weak "0" signal bitline and its reference bitline is 23.5 mV (123.54 mV-100 mV). Thus, a difference voltage for a weak "1" or "0" read of FIG. 10F is about 0.7 mV more than a corresponding difference voltage for a weak "1" or a weak "0" read of FIG. 10E. This is more than a 3% increase in the difference voltage of FIG. 10F over the difference voltage of FIG. 10E and advantageously reduces read errors for weak data states. Moreover, since the coupling models of FIGS. 9A and 9B are linear, this advantage will apply for other parametric values of N, $C_p$, and $C_F$.

Figure 11:
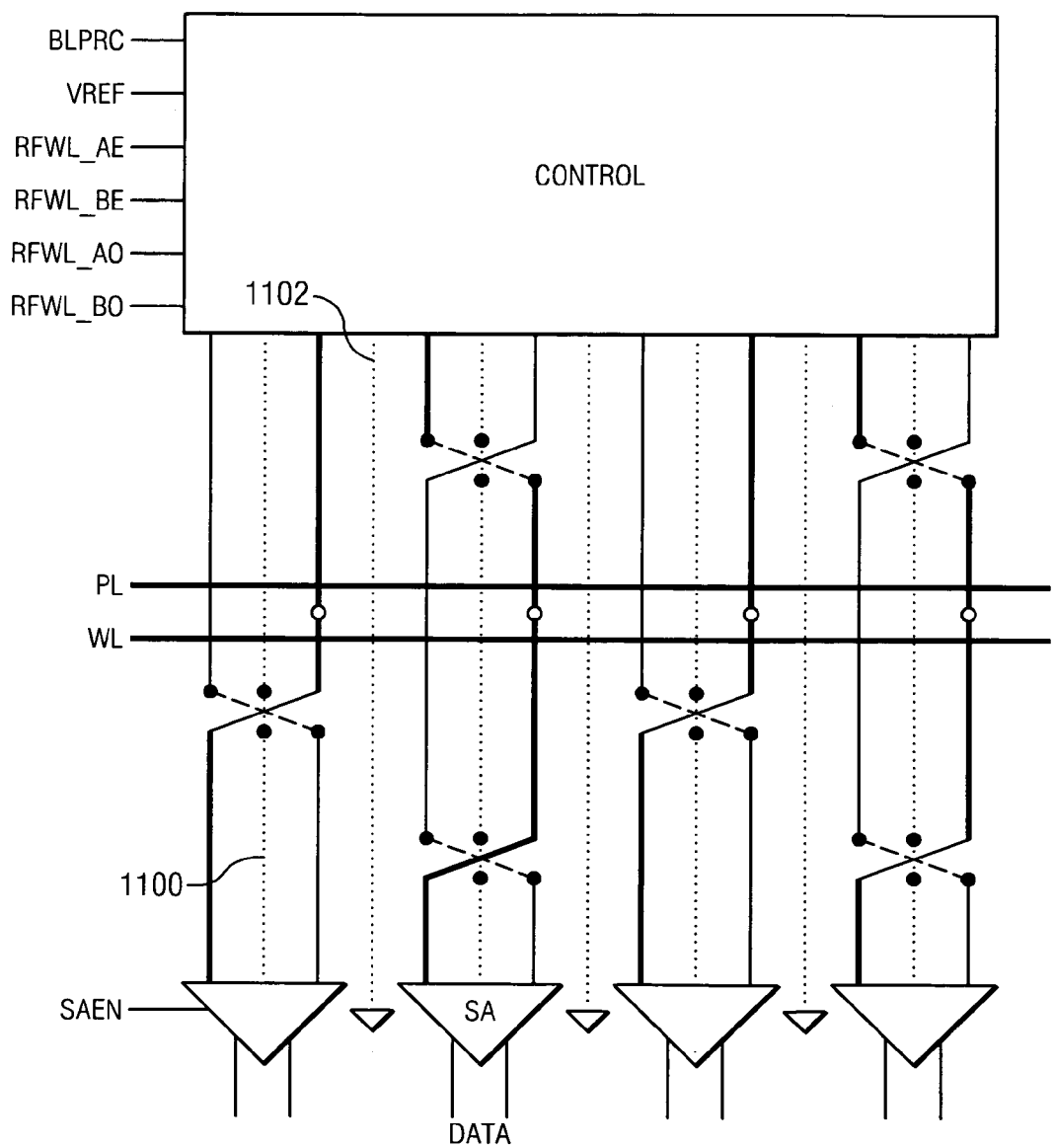
FIG. 11 is an alternative embodiment of the memory array of FIG. 8.

Turning now to FIG. 11, there is an alternative embodiment of the memory array of FIG. 8. The memory array of FIG. 11 is the same as previously presented at FIG. 8 except that shields 1100 and 1102 have been added. Shields 1100 and 1102 are preferably formed of the same conductor as signal and reference bitlines and are connected to a base voltage terminal such as ground. Shields 1100 are formed between each signal and reference bitline of a column. Shields 1102 are formed between each column and adjacent columns. In this manner, coupling between signal bitlines and reference bitlines due to fringe capacitance is substantially eliminated. In an alternative embodiment, only shields 1100 are employed between signal and reference bitlines of each column. This advantageously reduces the layout area penalty and still reduces fringe capacitance coupling from 1.5 $C_p$ to 0.5 $C_F$. In another alternative embodiment, only shields 1102 are employed between adjacent columns.

Still further, while numerous examples have thus been provided, one skilled in the art should recognize that various modifications, substitutions, or alterations may be made to the described embodiments while still falling with the inventive scope as defined by the following claims. Other combinations will be readily apparent to one of ordinary skill in the art having access to the instant specification.

What is claimed is:

1. A method of reading a memory cell, comprising:
   precharging a first bitline to a base voltage;
   precharging a second bitline to the base voltage;
   connecting a reference voltage generator to the first bitline;
   charging the first bitline to a reference voltage from the reference voltage generator;
   disconnecting the reference voltage generator from the first bitline;
   applying a signal voltage from the memory cell to a second bitline after the step of disconnecting; and
   amplifying a difference voltage between the first and second bitlines.

2. A method as in claim 1, wherein the reference voltage generator comprises a voltage supply.

3. A method as in claim 1, wherein the reference voltage generator comprises a capacitor.

4. A method as in claim 3, wherein the capacitor is programmable.

5. A method as in claim 3, wherein the capacitor is precharged to a first voltage prior to the step of connecting.

6. A method as in claim 1, wherein the step of applying comprises activating a plateline of the memory cell, and wherein the memory cell is a ferroelectric memory cell.

7. A method as in claim 1, wherein the step of applying comprises activating a wordline of the memory cell, and wherein the memory cell is a dynamic random access memory cell.

8. A method of operating a memory system, comprising:
   precharging a plurality of first bitlines to a base voltage;
   precharging a plurality of second bitlines to the base voltage;
   connecting a reference voltage generator to the plurality of first bitlines;
   charging each of the first bitlines to a reference voltage from the reference voltage generator;
   disconnecting the reference voltage generator from the plurality of first bitlines;
   applying a respective signal voltage to each of the plurality of second bitlines from a respective memory cell after the step of disconnecting, wherein each of the second bitlines forms a bitline pair with one of the first bitlines; and
   amplifying a respective difference voltage between each bitline pair of the plurality of first and second bitlines.

9. A method as in claim 8, wherein each bitline pair comprises a twisted bitline pair.

10. A method as in claim 8, wherein the reference voltage generator comprises a capacitor.

11. A method as in claim 10, wherein the capacitor is programmable.

12. A method as in claim 10, wherein the capacitor is precharged to a first voltage prior to the step of connecting.

13. A method as in claim 8, wherein the step of applying comprises activating a plateline coupled to a plurality of ferroelectric memory cells.

14. A method as in claim 8, wherein the step of applying comprises activating a wordline coupled to a plurality of dynamic random access memory cells.

15. A method as in claim 8, wherein the memory system is controlled by a processor, and wherein the memory system is formed on a single integrated circuit.

16. A method of reading a memory cell, comprising:
    precharging the first bitline to a first voltage;
    floating the first bitline;
    precharging the second bitline to a second voltage different from the first voltage;
    floating the second bitline;
    applying a signal voltage from the memory cell to the second bitline after the step of floating the first and second bitlines; and
    amplifying a difference voltage between the first and second bitlines.

17. A method as in claim 16, wherein the first voltage comprises a supply voltage.

18. A method as in claim 16, wherein the step of precharging the first bitline comprises connecting the first bitline to a reference voltage generator.

19. A method as in claim 18, wherein the reference voltage generator comprises a programmable capacitor.

20. A method as in claim 16, wherein the memory cell is a one-transistor, one-capacitor (1T1C) memory cell.

21. A method as in claim 16, wherein the memory cell is a ferroelectric memory cell.

22. A memory array, comprising:
    a plurality of first bitlines comprising a first material;
    a plurality of second bitlines comprising the first material;
    at least one shield comprising the first material formed between at least one of the first bitlines and one of the second bitlines, said at least one shield being spaced apart from the at least one of the first bitlines and one of the second bitlines.

23. A memory array as in claim 22, wherein each first bitline of the plurality of first bitlines forms a bitline pair with a respective second bitline of the plurality of second bitlines.

24. A memory array as in claim 23, wherein the at least one shield is formed between said each first bitline and said respective second bitline of each said bitline pair.

25. A memory array as in claim 23, wherein the at least one shield is formed between each said bitline pair.

26. A memory array as in claim 23, wherein each said bitline pair comprises a twisted bitline pair.

\* \* \* \* \*